US 6,683,902 B1

(12) United States Patent
Ohki et al.

(10) Patent No.: US 6,683,902 B1
(45) Date of Patent: Jan. 27, 2004

(54) SEMICONDUCTOR LASER MODULE (75) Inventors: Yutaka Ohki, Tokyo (JP); Takeharu Yamaguchi, Tokyo (JP); Yuichiro Irie, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 258 days.

(21) Appl. No.: 09/662,118

(22) Filed: Sep. 14, 2000

(30) Foreign Application Priority Data

Sep. 16, 1999 (JP) .......................................... 11-262055
Aug. 21, 2000 (JP) ....................................... 2000-250025

(51) Int. Cl.[7] ................................................ H01S 3/08
(52) U.S. Cl. ...................... 372/105; 372/27; 372/102; 372/98; 372/6; 372/19; 385/97
(58) Field of Search ................................. 372/105, 102, 372/18, 19, 27, 6, 29.022; 385/97, 96, 98

(56) References Cited

U.S. PATENT DOCUMENTS

| 4,603,941 | A | * | 8/1986 | Fujii et al. ..................... 385/11 |
| 4,748,687 | A | | 5/1988 | Auracher et al. |
| 5,237,630 | A | * | 8/1993 | Hogg et al. .................... 385/12 |
| 5,485,481 | A | * | 1/1996 | Ventrudo et al. .............. 372/6 |
| 5,659,559 | A | | 8/1997 | Ventrudo et al. |
| 5,841,797 | A | | 11/1998 | Ventrudo et al. |
| 5,881,185 | A | * | 3/1999 | Feth et al. ..................... 385/11 |
| 6,256,330 | B1 | * | 7/2001 | LaComb ....................... 372/46 |

FOREIGN PATENT DOCUMENTS

| EP | 0 712 183 | 5/1996 |
| JP | 9-162490 | 6/1997 |
| JP | 2000-28852 | 1/2000 |

OTHER PUBLICATIONS

Patent Abstracts of Japan, JP 60–145689, Aug. 1, 1985.
Y. Zhao, et al., IEEE Photonics Technology Letters, vol. 9, No. 11, pp. 1436–1438, "Single–Mode Operation Characteristics of a Self–Injection Seeded Fabry–Perot Laser Diode With Distributed Feedback From A Fiber Grating", Nov. 1997.
T. Morioka, et al., 2417 Optical Engeneering, vol. 29, No. 3, pp. 200–209, "All–Optical Ultrafast Nonlinear Switching Utilizing the Optical Kerr Effect in Optical Fibers", Mar. 1990.

* cited by examiner

*Primary Examiner*—Jerome Jackson
*Assistant Examiner*—Matthew C. Landau
(74) *Attorney, Agent, or Firm*—Oblon, Spivak, McClelland, Maier & Neustadt, P.C.

(57) ABSTRACT

The present invention provides a semiconductor laser module. A semiconductor laser module (1A) comprising a semiconductor laser element (2a) and an optical fiber (3a) optically coupled by an optical coupling means (2b) is provided, wherein on the optical fiber (3a), a reflective portion (4) and a birefringence fiber (3a) are provided, the birefringence fiber (3a) is provided at least from the incident end on the side of the optical coupling means (2b) to immediately before the reflective portion (4), a connection portion (6) is provided at least at one point in the longitudinal direction of the birefringence fiber (3a), and in the connection portion (6), two eigen axes of X axes and Y axes are connected so that the eigen axes intersect each other at an established angle θ.

20 Claims, 4 Drawing Sheets

SEMICONDUCTOR LASER MODULE

FIELD OF THE INVENTION

The present invention relates to a semiconductor laser module and, in particular, to a semiconductor laser module which comprises an external resonator having a stable oscillating condition.

BACKGROUND OF THE INVENTION

In recent years, semiconductor lasers have come to be used extensively as light sources for signals and as light sources for pumping optical fiber amplifiers in the field of optical transmission. When a semiconductor laser is used as a light source for signals and as a light source for pumping an optical fiber amplifier for optical transmission, the semiconductor laser is often used in a semiconductor laser module which is a device for optically coupling laser beams from the semiconductor laser (semiconductor laser element) with an optical fiber by an optical coupling means.

In order to stabilize the wavelength of the light emitted from the semiconductor laser element, for example, this semiconductor laser module optically feed backs the light from the semiconductor laser element by a fiber Bragg grating (hereinafter, simply referred to as "FBG").

However, when an external resonator comprises the FBG, conditions of deflected light fed back may have a component different from a polarization direction that can be amplified by the semiconductor laser depending on form conditions of the optical fiber such as a winding method, and the amount of light fed back effectively changes and, as a result, oscillation conditions may change.

As a countermeasure therefor, use of a birefringence fiber can be considered. By means of the birefringence fiber, a plane of polarization is maintained, the amount of light fed back can almost uniformly be maintained, and it becomes possible to suppress the fluctuation in oscillation conditions caused by the change in form such as the winding method of the optical fiber.

However, it was found that use of the birefringence fiber has a harmful influence in that peaks at same intervals arise on the spectrum and the oscillation conditions become unstable as time elapses.

Herein, where the length from the incident end of the optical coupling means side to the center of the reflective portion in the optical fiber is defined as L, the birefringence amount of the optical fiber is defined as $\Delta n$, and the oscillation wavelength is defined as $\lambda$, according to the characteristics of the birefringence fiber, the propagation coefficient of light is different between eigen axes, that is, between X axis and Y axis, therefore, when the light returns after reflected by the FBG, the phase difference $4\pi \cdot \Delta n \cdot L / \lambda$ occurs between the light propagated through the respective eigen axes.

On the other hand, the semiconductor laser element oscillates in TE (transverse electric) mode, whereas a very little amount of TM (transverse magnetic) mode also exists.

Also, when the eigen axes of the birefringence fiber are slightly shifted from the direction of TE mode of the semiconductor laser element and fixed to the module, light in is made incident onto both the X axis and Y axis in the birefringence fiber.

Also, there is no possibility that the crosstalk between the eigen axes of the birefringence fiber becomes absolutely 0.

Due to the abovedescribed factors, when light is slightly made incident into both of the X axis and Y axis and the light, which created interference due to the phase difference at propagation of each of the light, is fed back to the semiconductor element in the polarization direction that can be amplified, it is assumed that peaks at intervals of $\lambda^2 / (2 \cdot \Delta n \cdot L)$ arise on the spectrum.

Such excessive peaks have been one of the causes whereby the harmful influence such that time instability occurs in the oscillation conditions of the abovedescribed semiconductor laser element with the FBG.

Figure 6:
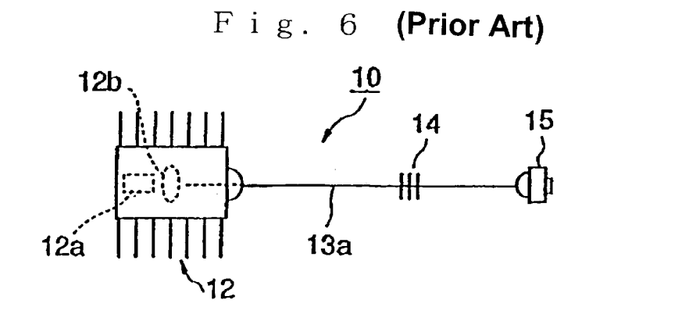
FIG. 6 is an example of the semiconductor laser module according to the prior art.

FIG. 6 is a schematic view of a semiconductor laser module 10 according to the prior art.

In FIG. 6, the semiconductor laser module 10 comprises a semiconductor laser element 12a and an optical coupling means 12b composed of a lens, etc. in a package 12.

Then, in the package 12, one end (incident end) of an optical fiber 13a composed of a birefringence fiber which receives light emitted from the semiconductor laser element 12a via the optical coupling means 12b is disposed and which is extended to the outside of the package 12.

An optical connector 15 is provided on the other end side of the optical fiber 13a. 14 denotes an FBG which is provided in the optical fiber 13a and comprises an external resonator.

Figure 7:
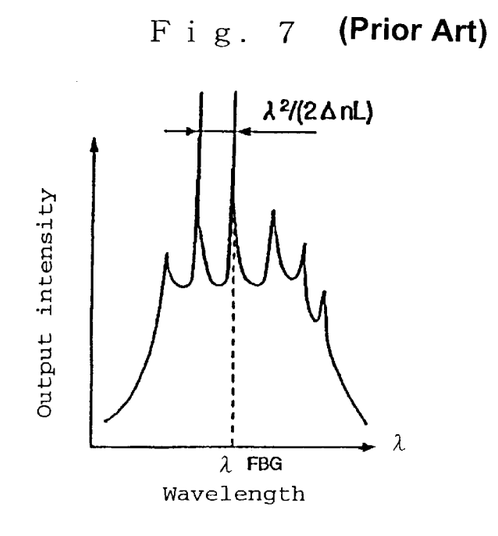
FIG. 7 is an explanatory view showing output spectral characteristics of the semiconductor laser module according to the prior art.

FIG. 7 is an explanatory chart showing the relationship between the output intensity and oscillation wavelength of the semiconductor laser module 10. As shown in FIG. 7, stable oscillation with a high mode suppressing ratio cannot be performed at the center wavelength of reflection of the FBG $\lambda_{FBG}$, and the peaks are generated at intervals of $\lambda^2 / (2 \cdot \Delta n \cdot L)$.

OBJECT AND SUMMARY OF THE INVENTION

The present invention is made for solving such problems as the unstable oscillation conditions of the semiconductor laser module according to the prior art, and the object thereof is to provide a semiconductor laser module in which stable oscillation conditions can be provided regardless of the fluctuations in the form such as a winding method of the optical fiber.

In order to achieve the object as described above, the present invention provides a semiconductor laser module having the following construction. That is, a semiconductor laser module according to the present invention is the semiconductor laser module comprising a semiconductor laser element and an optical fiber optically coupled by an optical coupling means, wherein on the optical fiber, a reflective portion for reflecting light emitted from the semiconductor laser toward the side of the semiconductor laser element and a birefringence fiber having eigen axes and provided with birefringent characteristics are provided, said birefringence fiber is provided at least between the incident end on the optical coupling means side of the optical fiber and immediately before the reflective portion, the birefringence fiber has, at least, a connection portion where birefringence fibers are connected to each other, and at the said connection portion, eigen axes of the connected birefringence fibers are in a condition where the eigen axes are shifted in relation to each other by an established rotating angle $\theta$.

The connection portion between the birefringence fibers is usually fusion-connected and preferably, where the length from the incident end on the optical coupling means to the center position of the reflective portion of the optical fiber is set as L, the connection portion between the birefringence fibers locates within the length of $L/2 \pm L/3$ from the optical coupling means side.

In addition, the established rotating angle θ is preferably within 90±10° or within 45±10°.

The reflective portion can comprise a fiber Bragg grating, an optical connector, or a fiber cut section.

In addition, the birefringence fiber comprises an optical fiber where axially asymmetric stress is applied to the core, that is, any of a PANDA fiber whose stress applying part has a circular section, a bow-tie fiber whose stress applying part has a fan-shaped section, or an oval jacket fiber whose stress applying part has an oval section, or an oval core optical fiber where the core is oval and the waveguide structure of the core is axially asymmetric.

The optical fiber can comprise a birefringence fiber having an established length L3 provided from the center position in the longitudinal direction of the reflective portion toward the side of the optical transmission direction, and further comprise a polarization independent fiber having an established length L4 connected on the tip of the birefringence fiber having the said established length L3.

In one aspect of the present invention, the length from the incident end to the connection portion of the birefringence fiber provided between the incident end on the optical coupling means side and immediately before the reflective portion of the optical fiber is defined as L1, the length from the connection portion of the birefringence fiber to the center position of the reflective portion is defined as L2, and |L1−L2| is defined as ΔL, and where ΔL≠0, the established length L3 of the birefringence fiber provided from the center position of the reflective portion toward the side of optical transmission direction is 1/ΔL≦1/L3.

In another aspect of the present invention, the following construction is provided. That is, the optical fiber comprises a birefringence fiber having an established length L3 provided from the center position of the reflective portion toward the side of optical transmission direction, and where the oscillation wavelength is λ, the birefringence amount of the optical fiber is Δn, the length from the incident end to the connection portion of the optical fiber is L1, the length from the connection portion to the center position of the reflective portion of the optical fiber is L2, and an amount defined by the following formula containing the values of L1, and L2, and L3 as calculation values as well as containing the calculation values of all the combinations of addition and subtraction of L1, and L2, and L3 is set as $L_x$;

$$L_x = |P_1 L1 \pm P_2 L2 \pm P_3 L3|$$

($P_i$=0 or 1, $\Sigma P_i \neq 0$, $i$=1, 2, 3), the oscillation spectrum does not have any peak intervals expressed by $\lambda^2/(2 \cdot \Delta n \cdot L_x)$.

Furthermore, the present invention provides a semiconductor laser module having the following construction. That is, the semiconductor laser module comprising a semiconductor laser element and an optical fiber are optically coupled by means of an optical coupling means, wherein on the optical fiber, a reflective portion for reflecting light emitted from the semiconductor laser element toward the side of the semiconductor laser element and a birefringence fiber provided with birefringent characteristics are provided, said birefringence fiber is provided at least between the incident end on the optical coupling means side and immediately before the reflective portion, and where two orthogonal eigen axes of the birefringence fiber having different refractive indexes from each other are defined as X axis and Y axis, respectively, when the light emitted from the semiconductor laser element was made incident into the optical fiber, reflected by the reflective portion, and returned to the incident end, the value ΔΦ of the phase difference between the light made incident with its X axis polarization and returned with its X axis polarization and the light made incident with its Y axis polarization and returned with its Y axis polarization is set so as to become smaller than the value of $4\pi \cdot \Delta n \cdot L/\lambda$ derived from the length from the incident end on the optical coupling means side to the center of the reflective portion of the optical fiber L, the birefringence amount of the optical fiber Δn, and the oscillation wavelength λ.

The present invention further provides a semiconductor laser module having the following construction. That is, the semiconductor laser module comprising a semiconductor laser element and an optical fiber are optically coupled by means of an optical coupling means, wherein on the optical fiber, a reflective portion for reflecting light emitted from the semiconductor laser element toward the side of the semiconductor laser element and a birefringence fiber provided with birefringent characteristics are provided, said birefringence fiber is provided at least between the incident end on the optical coupling means side and immediately before the reflective portion, and where two orthogonal eigen axes of the birefringence fiber having different refractive indexes from each other are defined as the X axis and Y axis, respectively, when the light emitted from the semiconductor laser element was made incident into the optical fiber, reflected by the reflective portion, and returned to the incident end, the value ΔΦ of the phase difference between the light made incident by X axis polarization and returned by X axis polarization and the light made incident by X axis polarization and returned by X axis, polarization is greater than the value of $4\pi \cdot n_{LD} \cdot L_{LD}/\lambda$ derived from the refractive index of the laser diode (chip) $n_{LD}$, the resonator length of the semiconductor laser (element) $L_{LD}$, and the oscillation wavelength λ.

According to the semiconductor laser module having the abovedescribed construction, for stabilizing the oscillation conditions, the phase difference between the eigen axes of the birefringence fiber (hereinafter, simply referred to as "phase difference") at the time when the light was made incident and returned is manipulated, thereby the object is achieved.

In the present invention, the phase difference is manipulated by two concrete manipulations, that is, by rotating the eigen axes of the birefringence fiber at the midway (connection portion) of the external resonator by an established angle θ and by appropriately adjusting the position of the connection portion in the longitudinal direction of the optical fiber, and as a result, the oscillation conditions are stabilized.

By rotating and connecting the axes of the birefringence fiber, only the optical phase is manipulated and the original effect to maintain polarization is not lost, thereby the amount of light fed back is uniformly maintained.

However, if a phase difference exists there, peaks arise at intervals of $\lambda^2/(2 \cdot \Delta \cdot L_x)$ on the oscillation spectrum. Herein, λ is a oscillation wavelength of the external resonator, Δn is a refractive index difference between the eigen axes of the birefringence fiber (hereinafter, referred to as "birefringence amount".

Therefore, in the present invention, by decreasing the phase difference, such peak intervals are made very wide, for example, wider than the gain spectrum of the semiconductor laser element or, when an FBG is used, the peak intervals are made wider than its reflection spectral bandwidth, thereby eliminating or significantly diminishing peaks that arise on the oscillation spectrum.

Preferably, when the phase difference can be eliminated, peak intervals become infinite and, in essence, peaks do not exist, therefore, the oscillation conditions of the external resonator are stabilized.

On the other hand, by greatly increasing the phase difference, the peak intervals are made narrower than the longitudinal mode intervals calculated based on the oscillator length $L_{LD}$ of the semiconductor laser element, thereby reducing influence due to the phase difference on the oscillation conditions.

Herein, by connecting the axes of the birefringence fiber after rotating them at 90° to each other at the midpoint of the birefringence fiber composing a part of the external resonator, the phase difference is nearly eliminated.

However, in such method, since a connection portion is formed on the optical fiber, it is preferable to take reflection at the connection portion into consideration. It is because it is actually impossible to make the connection portion without producing reflection and, as far as the connection has any reflections, there is a possibility that even very small reflection can influence phases between the eigen axes.

Also, when an FBG is used as a reflective portion, since complex amplitude reflectance accompanied by phase changes must be taken into consideration, its phase prerequisites are also different from a simple reflection plane.

Namely when the connection portion is provided at the midpoint of the birefringence fiber composing the external resonator, because of the reasons described above, the phase difference cannot actually become 0.

In such a case, where the length of the birefringence fiber is defined as L, the length from the incident end to the connection portion of the birefringence fiber is defined as L1, and the length from the connection portion to the center position of the reflective portion of said birefringence fiber is defined as L2, it becomes possible to manipulate phase conditions of the light which returns to the semiconductor laser element not by changing the prerequisites of L=L1+L2, L1=L2=L/2 but by appropriately changing the size of L1 and L2.

In addition, in a case where the reflection from the optical fiber end face on the optical transmission direction with respect to the FBG is taken into consideration, it is necessary to optimize not only L1 and L2 but also the relationship between $\Delta L=|L1-L2|$ and L3. When $\Delta L \neq 0$, the influence is small if peak intervals $\lambda^2/(2 \cdot \Delta n \cdot L3)$ made to occur by L3 are wider than intervals $\lambda^2/(2 \cdot \Delta n \cdot \Delta L)$ based on $\Delta L$. That is, selecting L3 so as be $1/\Delta L \leq 1/L3$ is appropriate.

As described above, in the present invention, by appropriately selecting L1, L2, and L3, peaks of all wavelength intervals calculated based on $L_x$ are more optimally suppressed, thereby enabling the external resonator to oscillate stably.

Furthermore, a semiconductor laser module having the birefringence fiber without an FBG is also important in practical use. Since the semiconductor laser module is very sensitive to reflection from various spots, if it has no FBG, a connector and a cut section of an optical fiber can be regarded as external feed back portions without wavelength selectivity. The cut section of the optical fiber may be cut vertically or diagonally with respect to the longitudinal direction of the optical fiber.

According to the present invention, even in a situation where reflection from the connector or cut section of the optical fiber has an influence, by composing the appropriate external resonator as described above, stable oscillation can be realized.

Also, in a case where the eigen axes of the birefringence fiber are rotated at 45° and are fusion-connected to each other, although phases cannot completely be compensated, there is an effect that reduces interactions between the eigen axes.

Furthermore, according to the present invention, a polarization independent fiber can be connected on the tip of the birefringence fiber. In such case, there is an advantage such that loss due to the difference in mode fields, etc. is small when another polarization independent fiber is connected by means of a fixture.

As has been described above, according to the semiconductor laser module of the present invention, by using a birefringence fiber of the optical fiber composing an external resonator for the semiconductor laser module which has an unstable oscillation condition based on fluctuations in the form such as the winding method of the optical fiber, a semiconductor laser module which stably oscillates can be achieved while the oscillation mode of the semiconductor laser module having the external resonator maintains a high mode suppressing ratio.

BRIEF DESCRIPTION OF THE DRAWINGS

Exemplary embodiments of the invention will now be described in conjunction with the drawings in which.

DETAILED DESCRIPTION OF THE PREFERRED EMBODIMENT

Hereinafter, the present invention will be described in detail based on preferred embodiments.

Embodiment 1

Figure 1:
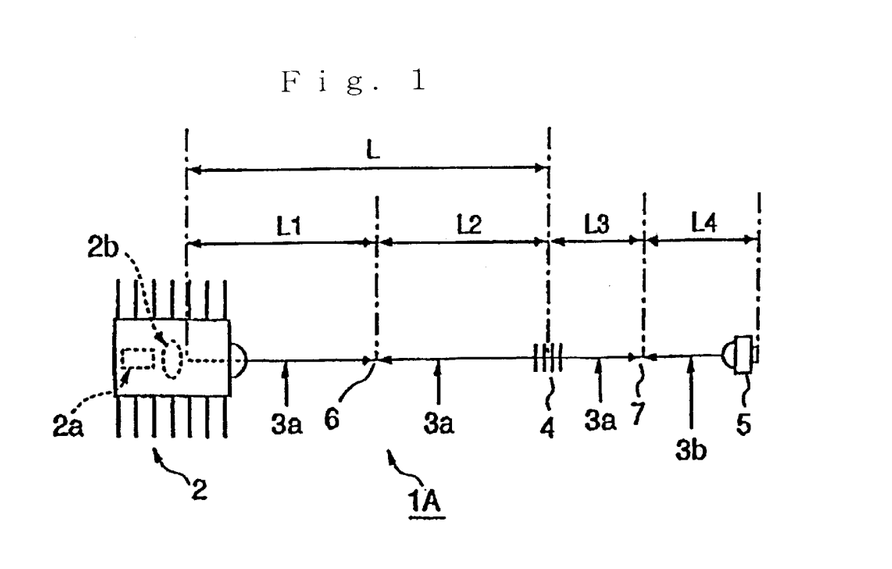
FIG. 1 is an explanatory view showing a first embodiment of the semiconductor laser module according to the present invention.

FIG. 1 is a schematic view showing Embodiment 1 of the invention. In FIG. 1, a semiconductor laser module 1A comprises an optical coupling means 2b composed of a semiconductor laser element 2a and lens, etc. in a package 2.

Then, in the package 2, one end (incident end) of an optical fiber 3a which receives light emitted from the semiconductor laser element 2a via the optical coupling means 2b is disposed and which is extended to the outside of the package 2. An optical fiber 3b is connected on the other end side of the optical fiber 3a and an optical connector 5 is provided on the other end of the optical fiber 3b.

4 denotes a reflective portion provided in the optical fiber 3a and here an FBG is used. The reflective portion 4 and semiconductor laser element 2a form an external resonator. 6 denotes a connection portion where the optical fiber 3a and optical fiber 3a are fusion-connected. 7 denotes a connection portion where the optical fiber 3a and optical fiber 3b are fusion-connected.

Furthermore, the optical coupling means 2b may be a single lens or an end portion of the optical fiber 3a having a lens shape such as a wedge-shape.

Figure 3A:
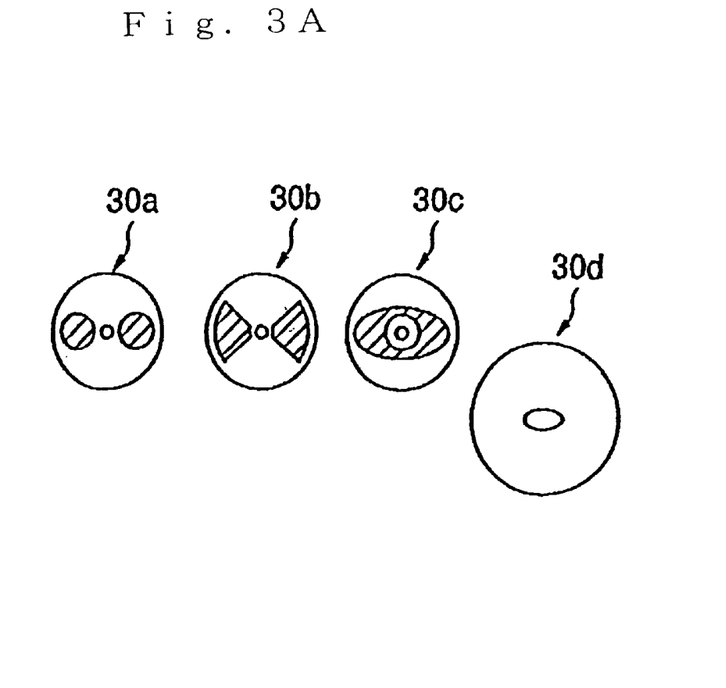
FIG. 3A is an explanatory view showing sections of birefringence fibers used in the semiconductor laser module according to the invention.

A birefringence fiber is used as the optical fiber 3a. A birefringence fiber where axially asymmetric stress is applied to its core is selected. For example, as shown in FIG. 3A, a PANDA fiber 30a whose stress applying part has a circular section, a bow-tie fiber 30b whose stress applying part has a fan-shaped section, or an oval jacket fiber 30c whose stress applying part has an oval section can be used. In FIG. 3A, the shaded portions indicate the stress applying parts. Herein, to apply axially asymmetrical stress means that stress applied to one axis of two eigen axes and stress applied to another axis are not same.

Moreover, as the birefringence fiber, as shown in FIG. 3A, an oval core optical fiber 30d where its core is oval may be used. The oval core optical fiber is an optical fiber where the waveguide structure of the core is axially asymmetric.

In the birefringence fiber, by producing the waveguide structure and axially asymmetrical characteristics of stress, an eigen axis having a greater refractive index and an eigen axis having a smaller refractive index are formed, as a result, difference of the refractive indexes, namely, a birefringence amount $\Delta n$ occurs between the eigen axes.

Moreover, as the optical fiber 3b, a polarization independent fiber, for example, an SMF (single mode fiber), a DSF (dispersion shift fiber), an RDF (reverse dispersion fiber, manufactured by Furukawa Denki Kogyo Kabushiki Kaisha) can be used.

Figure 3B:
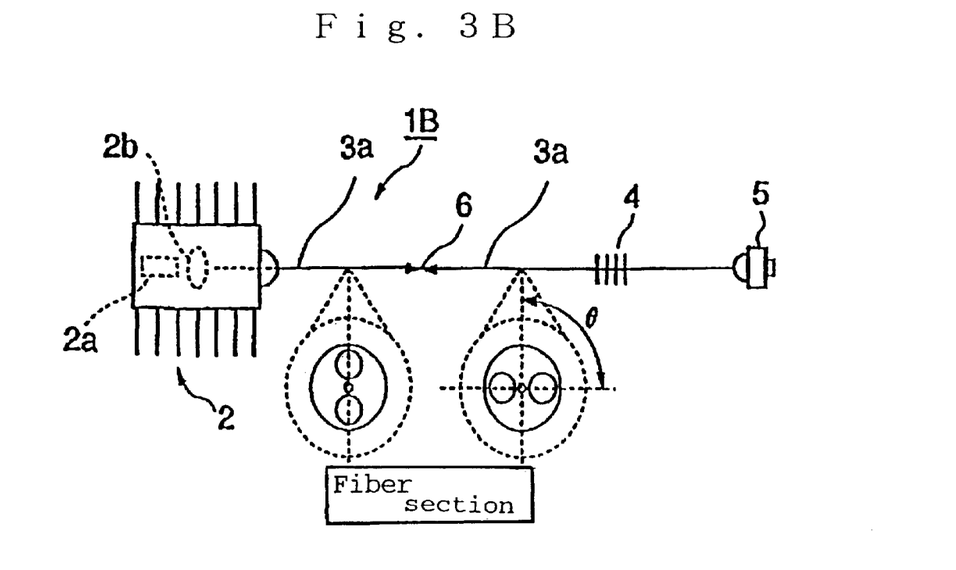
FIG. 3B is an explanatory view showing a condition where eigen axes of birefringence fibers are rotated and connected in the semiconductor laser module according to the invention.

FIG. 3B is an explanatory view illustrating partial sections of the birefringence fiber in the longitudinal direction in an enlarged manner for the purpose of clarifying the condition where the eigen axes of the birefringence fiber are rotated and connected.

As shown in FIG. 3B, the connection portion 6 is formed by connecting the eigen axes to each other so as to be a series in the longitudinal direction with a rotated condition at an established rotating angle $\theta$ (=90°).

In the optical fiber 3a, the length from one end (incident end) of the optical fiber 3a to the connection end 6 is set as L1, the length from the connection portion 6 to the center position of the reflective portion 4 is set as L2, and the length from the center position of the reflective portion 4 to the connection portion 7 is set as L3.

Also, in the optical fiber 3a, the total length of the length L1 from one end (incident end) of the optical fiber 3a to the connection end 6 and the length L2 from the connection portion 6 to the center position of the reflective portion 4 is set as L. In the optical fiber 3b, the length from the connection portion 7 to the connector 5 is set as L4.

Hereinafter, a concrete example of Embodiment 1 is described.

The PANDA fiber is used as the optical fiber 3a, the length thereof is set to the following values, the FBG is used as the reflective portion 4, and the rotating angle $\theta$ in the connection portion 6 is set to the following value.

(1) The length from one end (incident end) of the optical fiber 3a to the connection portion 6 is set as L1 and the length from the connection portion 6 to the center position of the reflective portion 4 is set as L2, and L1 and L2 are set so as to satisfy the setting prerequisite of "within $L/2\pm L/3$", that is, L1=0.9 m and L2=1.2 m.

(2) The rotating angle $\theta$ in the connection portion 6 is set so as to satisfy the setting prerequisite of "within 90°±10°", that is, the angle is 90°.

(3) When |L1−L2| is defined as $\Delta L$ and $\Delta L \neq 0$, L3=0.2 m is set so as to satisfy the setting prerequisite of "$1/\Delta L \leq 1/L3$".

When laser oscillation is performed in such a construction by the external resonator formed between the semiconductor laser element 2a and the center position of the reflective portion 4, the phase difference occurs between the eigen axis X and eigen axis Y in the optical fiber 3a and optical fiber 3a, respectively, which are connected in the connection portion 6. However, since these optical fibers 3a have approximately the same length and are connected with the rotating angle $\theta$=90°, the abovedescribed phase differences are cancelled out.

In addition, since the requirement of $1/\Delta L \leq 1/L3$ is also satisfied, the peak intervals $\lambda^2/(2 \cdot \Delta n \cdot L3)$ occurred due to L3 becomes wider than the intervals $\lambda^2/(2 \cdot \Delta n \cdot \Delta L)$ based on $\Delta L$. Accordingly, influence due to reflection from the optical fiber end face on the side of the optical transmission direction is reduced.

Therefore, laser oscillation in the external resonator is stabilized as time elapses.

Moreover, since the connector 5 is connected via the optical fiber 3b which is a polarization independent fiber on the tip of the optical fiber 3a, mode fields of the optical fibers coincide with each other when the connector 5 is connected to another general connector (not illustrated) to which a polarization independent fiber is likewise connected, and that is preferable.

Embodiment 2

Figure 2:
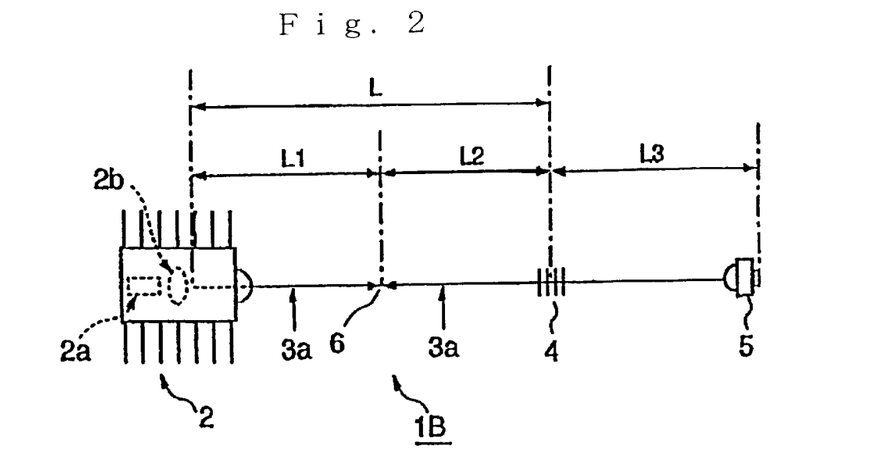
FIG. 2 is an explanatory view showing a second embodiment of the semiconductor laser module according to the present invention.

FIG. 2 is a schematic view showing Embodiment 2 of the present invention. A semiconductor laser module 1B in the FIG. 2 is characterized in that the optical fiber 3b provided in the semiconductor laser module 1A according to Embodiment 1 is omitted and the optical connector 5 is directly provided on the end portion of the optical fiber 3a. In addition, in the optical fiber 3a, the length from the center portion of the reflective portion 4 to the connector 5 is set as L3. Since the other constructions are similar to those of the semiconductor laser module 1A, repeated explanations are omitted.

Hereinafter, a concrete example of Embodiment 2 is described.

The PANDA fiber is used as the optical fiber 3a, the length thereof is set to the following values, the FBG is used as the reflective portion 4, the rotating angle $\theta$ in the connection portion 6 is set to the following value.

(1) The length from one end (incident end) of the optical fiber 3a to the connection portion 6 was set as L1 and the length from the connection portion 6 to the center position of the reflective portion 4 was set as L2, and L1 and L2 are set so as to satisfy the setting prerequisite of "within $L/2\pm L/3$", that is, L1=0.9 m and L2=1.2 m.

(2) The rotating angle $\theta$ in the connection portion 6 was set so as to satisfy the setting prerequisite of "within 90°±10°", that is, the angle was 90°.

(3) When |L1−L2| is defined as ΔL and ΔL≠0, L3=0.2 m is set so as to satisfy the setting prerequisite of "1/ΔL≦1/L3".

Similar to Embodiment 1, laser oscillation of the external resonator was stabilized in this example.

In addition, in Embodiment 2, since the optical fiber 3b is omitted and the connector 5 is directly connected on the end portion of the optical fiber 3a, mode fields coincide with each other when the connector 5 is connected to another connector (not illustrated) to which a polarization independent fiber is likewise connected, and that is preferable.

Furthermore, for example, in the semiconductor laser modules 1A and 1B according to Embodiment 1 and Embodiment 2, it is also possible to set L1 and L2 so as to satisfy the setting prerequisite of "within L/2±L/3", that is, L1=1.2 m and L2=0.8 m and to set the rotating angle θ of the connection portion 6 to 45° so as to satisfy another setting requisite of "within 45°±10°".

In this case, by setting θ to 45°, interactions between the eigen axis X and eigen axis Y can be reduced, and therefore that is preferable.

Embodiment 3

Figure 4A:
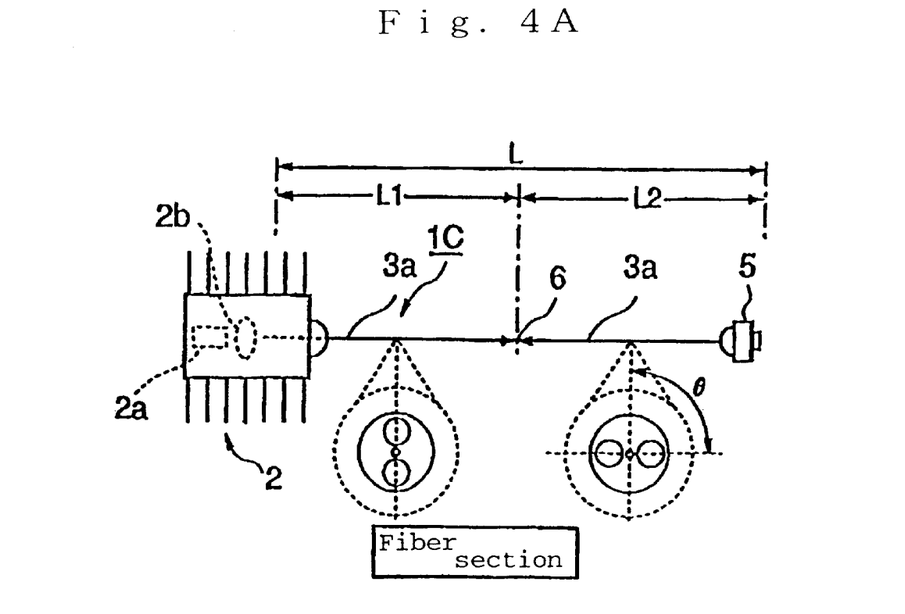
FIG. 4A is an explanatory view showing a third embodiment of the semiconductor laser module according to the present invention.

FIG. 4A is a schematic view showing Embodiment 3 of the present invention. A semiconductor laser module 1C in the FIG. 4A is characterized in that the optical connector 5 is used as the reflective portion.

In such case, the semiconductor laser module is constructed so that the optical fiber 3a does not exist beyond the optical connector 5, that is, on the emission side and light is transmitted via a space from the tip end of said connector 5. Since the other constructions are similar to those of the semiconductor laser module 1A, repeated explanations are omitted.

Hereinafter, a concrete example of Embodiment 3 is described.

In the semiconductor laser module 1C in the FIG. 4A, the PANDA fiber is used as the optical fiber 3a, the length thereof is set to the following values, the connector 5 is used as the reflective portion 4, and the rotating angle θ in the connection portion 6 is set to the following value.

(1) The length from one end (incident end) of the optical fiber 3a to the connection portion 6 was set as L1 and the length from the connection portion 6 to the optical connector 5 was set as L2, and L1 and L2 were set so as to satisfy the setting prerequisite of "within L2/±L/3", that is, L1=1 m and L2=1.2 m.

(2) The rotating angle θ in the connection portion 6 was set so as to satisfy the setting prerequisite of "within 90°±10°", that is, the angle was 90°.

Similar to Embodiment 1, laser oscillation of the external resonator was stabilized in this example.

Embodiment 4

Figure 4B:
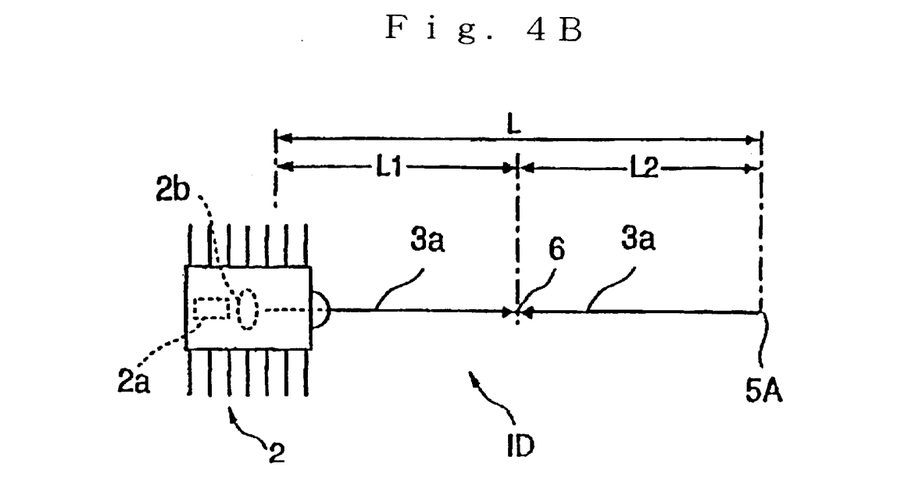
FIG. 4B is an explanatory view showing a fourth embodiment of the semiconductor laser module according to the present invention.

FIG. 4B is a schematic view showing Embodiment 4 of the present invention. A semiconductor laser module 1D in the FIG. 4B is characterized in that an optical fiber cut section 5A is used as the reflective portion.

Accordingly, the optical fiber 3a does not exist beyond the optical fiber cut section 5A, that is, on the emission side. Since the other constructions are similar to those of the semiconductor laser module 1A, repeated explanations are omitted.

A concrete example of Embodiment 4 is described.

In the semiconductor laser module 1D in the FIG. 4B, the PANDA fiber is used as the optical fiber 3a, the length thereof is set to the following values, the optical fiber cut section 5A is used as the reflective portion, the rotating angle θ in the connection portion 6 is set to the following value.

(1) The length from one end (incident end) of the optical fiber 3a to the connection portion 6 is set as L1 and the length from the connection portion 6 to the optical fiber cut section 5A is set as L2, and L1 and L2 are set so as to satisfy the setting prerequisite of "within L2/±L/3", that is, L1=2.2 m and L2=2 m.

(2). The rotating angle θ in the connection portion 6 is set so as to satisfy the setting prerequisite of "within 90°±10°", that is, the angle is 90°.

Similar to Embodiment 1, laser oscillation of the external resonator was stabilized in this example.

Embodiment 5

In the semiconductor laser modules 1A and 1B as shown in FIG. 1 and FIG. 2, where two orthogonal eigen axes of the birefringence fiber 3a having different refractive indexes to each other are defined as the X axis and Y axis, respectively, when light emitted from the semiconductor laser element was made incident into the optical fiber, reflected by the reflective portion, and returned to the incident end, Embodiment 5 is characterized by the value αΦ of the phase difference between the light made incident with its X axis polarization and returned with its X axis polarization and the light made incident with its X axis polarization and returned with its X axis polarization.

That is, Embodiment 5 is characterized in that the value ΔΦ of the phase difference is smaller than at least a phase difference which forms peak intervals of $4\pi \cdot \Delta n \cdot L/\lambda$ derived from the birefringence amount Δn and the oscillation wavelength λ.

Therefore, the PANDA fiber is used as the optical fiber 3a, the length thereof is set to the following values, the FBG is used as the reflective portion 4, the rotating angle θ in the connection portion 6 is set to the following value.

(1) The length from one end (incident end) of the optical fiber 3a to the connection portion 6 is set as L1 and the length from the connection portion 6 to the center position of the refraction portion 4 is set as L2, and these are set so that L1=2.2 m and L2=2 m.

(2) The rotating angle θ in the connection portion 6 is set so as to satisfy the setting prerequisite of "within 90°±10°", that is, the angle is 90°.

When abovedescribed values are set, $L=L1+L2=1$ m and $\Delta L=|L1-L2|=0.2$ m area provided, and when $\Delta n=3\times 10^{-4}$ and $\lambda=980$ nm, $4\pi \cdot \Delta n \cdot L/\lambda \approx 3800$ and $\Delta \Phi \approx 4\pi \cdot \Delta n \cdot \Delta L/\lambda \approx 770$ are provided. Thus ΔΦ is indeed smaller than $4\pi \cdot \Delta n \cdot \Delta L/\lambda$.

By such a method, the value ΔΦ of the phase difference can be reduced, thereby enabling the elimination or significant diminishment of peaks generated on the oscillation spectrum. As a result, oscillation conditions of the light can be stabilized.

Embodiment 6

In the semiconductor laser modules 1A and 1B as shown in FIG. 1 and FIG. 2, Embodiment 6 is characterized in that the value ΔΦ of the phase difference is set so as to be greater than the phase difference of the value of $4\pi \cdot n_{LD} \cdot L_{LD}/\lambda$ derived from the refractive index $n_{LD}$ and the length $L_{LD}$ of the semiconductor laser (element) resonator. Therefore, the PANDA fiber is used as the optical fiber 3a, the length thereof is set to the following values, the FBG is used as the reflective portion 4, the rotating angle θ in the connection portion 6 is set to the following value.

(1) The length from one end (incident end) of the optical fiber 3a to the connection portion 6 is set as L1 and the length from the connection portion 6 to the center position of the reflective portion 4 is set as L2, and these are set so that L1=11 m and L2=1 m.

(2) The rotating angle θ in the connection portion 6 is set so as to satisfy the setting prerequisite of "within 90°±10°", that is, the angle is 90°.

When abovedescribed values are set, $\Delta L = |L1 - L2| = 10$ m is provided, and when $n_{LD} = 3.5$, $L_{LD} = 800$ μm, $\lambda = 980$ nm, and $\Delta n = 3 \times 10^{-4}$, $4\pi \cdot n_{LD} \cdot L_{LD}/\lambda \approx 36000$ and $\Delta\Phi \approx 4\pi \cdot \Delta n \cdot \Delta L/\lambda \approx 38000$ are provided. Thus $\Delta\Phi$ is indeed smaller than $4\pi \cdot n_{LD} \cdot L_{LD}/\lambda$.

By such a method, the value $\Delta\Phi$ of the phase difference can be greatly increased, thereby enabling a reduced influence from said phase difference on the oscillation condition.

Embodiment 7

In the semiconductor laser modules 1A and 1B as shown in FIG. 1 and FIG. 2, where an amount defined by the following formula containing the values of L1, and L2, and L3 in calculation values as well as containing the calculation values of all the combinations of addition and subtraction of L1, and L2, and L3 is set as $L_x$;

$L_x = |P_1 L1 \pm P_2 L2 \pm P_3 L3|$ ($P_i = 0$ or 1, $\Sigma p_i \neq 0$, $_i = 1, 2, 3$), Embodiment 7 is characterized in that the oscillation spectrum does not have any peak intervals due to the so-called beat (peak intervals with respect to any $L_x$) expressed by $\lambda^2/(2 \cdot \Delta n \cdot L_x)$. Therefore, the PANDA fiber is used as the optical fiber 3a, the length thereof is set to the following values, the FBG is used as the reflective portion 4, and the rotating angle θ in the connection portion 6 is set to the following value.

(1) The length from one end (incident end) of the optical fiber 3a to the connection portion 6 is set as L1 and the length from the connection portion 6 to the center position of the reflective portion 4 is set as L2, and these are set so that L1=2 m, L2=1 m, and L3=0.5 m.

(2) The rotating angle θ in the connection portion 6 is set so as to satisfy the setting prerequisite of "within 90°±10°", that is, the angle is 90°.

By setting to the abovedescribed values, where $\lambda = 980$ nm and $\Delta n = 3 \times 10^{-4}$, $L_x$ takes the following values; $L_x = 0.5$ m, 1 m, 1.5 m, 2 m, 2.5 m, 3 m, and 3.5 m, and peak intervals of $\lambda^2/(2 \cdot \Delta n \cdot L_x) \approx 3.2$ nm, 1.6 nm, 1.1 nm, 0.8 nm, 0.64 nm, 0.53 nm, and 0.46 nm which are respectively calculated based on said $L_x$ values are not provided.

Therefore, oscillation wavelength can be prevented from becoming unstable.

Embodiment 8

According to Embodiment 8, in the semiconductor laser module 1B as shown in FIG. 2, the PANDA fiber is used as the optical fiber 3a, the length thereof is set to the following values, the optical connector 5 is used as the reflective portion 4, and the rotating angle θ in the connection portion 6 is set to the following value.

(1) The length from one end (incident end) of the optical fiber 3a to the connection portion 6 is set as L1 and the length from the connection portion 6 to the center position of the reflective portion 4 is set as L2, and L1 and L2 are set so satisfy the setting prerequisite of "within L2/±L/3", that is, L1=2 m and L2=2.1 m.

(2) The rotating angle θ in the connection portion 6 is set so as to satisfy the setting prerequisite of "within 90°±10°", that is, the angle is 90°.

Laser oscillation of the external resonator was stabilized in this example as well.

Figure 5:
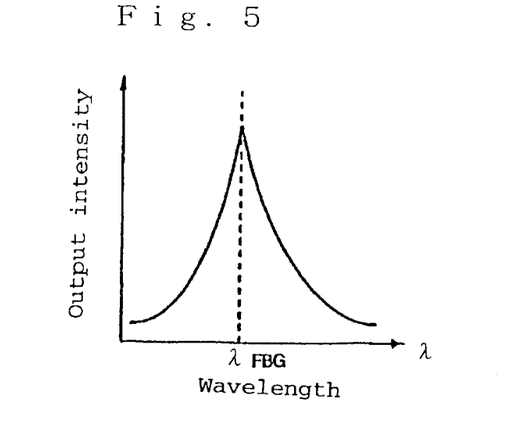
FIG. 5 is an explanatory view showing output spectral characteristics of the semiconductor laser module according to the present invention.

As has been described above, output intensity from the semiconductor laser module was checked in Embodiments 1 through 8 and, as a result, it was confirmed that the peaks at intervals of $\lambda^2/(2 \cdot \Delta n \cdot L_x)$, which have been recognized in the semiconductor laser module of the prior art, did not exist and stable oscillation is allowed while mode oscillation at $\lambda_{FBG}$ maintains a high mode suppression ratio as in FIG. 5 showing a chart of the representative spectrum of each Embodiment.

In addition, in Embodiment 4 or Embodiment 8, it was confirmed that in the cases where the optical connector 5 or the optical fiber cut section 5A is used as the reflective portion as well, by setting the optimal rotating angle θ in the connection portion 6, stable oscillation is allowed while the mode oscillation maintains a high mode suppression ratio.

Furthermore, in each Embodiment as described above, as the concrete means for connecting the eigen axes by rotating around the eigen axes of the birefringence fiber, the means wherein the birefringence fibers which are connected so as to be a series in the longitudinal direction is described, however, a means where the birefringence fibers are connected in parallel like a photo coupler may also be used in the present invention.

Moreover, the theme of the present invention is remarkable in a semiconductor laser module having a 980 nm band oscillation wavelength which is used as a pumping light source for an optical amplifier, in particular, in a semiconductor laser module wherein a semiconductor laser element having a ridge waveguide structure. Therefore, to apply the present invention to the semiconductor laser module having the 980 nm band oscillation wavelength provides great effects.

What is claimed is:

1. A semiconductor laser module comprising:
   a semiconductor laser element; and
   an optical fiber optically coupled to the laser element by an optical coupling system, wherein
   said optical fiber is provided with a reflective portion configured to reflect light emitted from said semiconductor laser element thereby to constitute an external cavity together with said semiconductor laser element, and
   wherein said optical fiber comprises at least two birefringence fibers each having two eigen axes, and has at least one connection portion connecting two of said at least two birefringence fibers such that eigen axes of one birefringence fiber are substantially orthogonal to eigen axes of the other birefringence fiber, said at least one connection portion being provided between an incident end of said optical fiber and said reflective portion.

2. The semiconductor laser module of claim 1, wherein, said connection portion is located at a distance within L/2±L/3 from said incident end, with L being a length between the incident end of said optical fiber and the reflective portion.

3. The semiconductor laser module of claim 1, wherein said reflective portion is a fiber Bragg grating.

4. The semiconductor laser module of claim 1, wherein said reflective portion comprises an optical connector.

5. The semiconductor laser module of claim 1, wherein said reflective portion comprises an fiber cut section.

6. The semiconductor laser module of claim 1, wherein said connection portion is formed by fusion-connection.

7. The semiconductor laser module of claim 1, wherein each of said two birefringence fiber have a stress applying part.

8. The semiconductor laser module of claim 1, wherein said optical fiber comprises a birefringence fiber having an established length L3 beyond a center position of said reflective portion along an optical transmission direction.

9. The semiconductor laser module of claim 8, wherein said optical fiber further comprises a polarization-independent fiber having an established length L4 connected to an end of said birefringence fiber having said established length L3.

10. A semiconductor laser module of claim 8, wherein
with L1 being a length of said birefringence fiber between said incident end and said connection portion, L2 being a length between said connection portion and said center position of said reflective portion, and ΔL being defined as |L1−L2|, said established length L3 of said birefringence fiber beyond said center position of said reflective portion satisfies an inequality: ΔL≧ΔL3.

11. The semiconductor laser module of claim 9, wherein
with L1 being a length of said birefringence fiber between said incident end and said connection portion, L2 being a length between said connection portion and said center position of said reflective portion, and ΔL being defined as |L1−L2|, said established length L3 of said birefringence fiber beyond said center position of said reflective portion satisfies an inequality: ΔL≧ΔL3.

12. The semiconductor laser module of claim 1,
wherein said optical fiber comprises a birefringence fiber having an established length L3 beyond a center position of said reflective portion along an optical transmission direction, and
wherein a length L1 of said birefringence fiber between said incident end and said connection portion, a length L2 of said birefringence fiber between said connection portion and said center position of said reflective portion, and said length L3, and a birefringence amount ΔL of said birefringence fiber are selected such that an oscillation wavelength is free of any peak intervals expressed as $\lambda^2/(2 \cdot \Delta n \cdot Lx)$, with λ being an oscillation wavelength, and Lx being a length calculated using a following formula for any combination of addition and subtraction of L1, L2, and L3, $Lx=|P1L1 \pm P2L2 \pm P3L3|$, ($Pi$=0 or 1, $\Sigma Pi \neq 0$, $i$=1,2,3).

13. A semiconductor laser module comprising:
a semiconductor laser element; and
an optical fiber optically coupled to the laser element by an optical coupling system,
wherein said optical fiber is provided with a reflective portion configured to reflect light emitted from said semiconductor laser element thereby to constitute an external cavity together with said semiconductor laser element, wherein said optical fiber comprises at least two birefringence fibers each having two eigen axes of X-axis and Y-axis which are orthogonal to and have different refractive indexes from each other, said optical fiber having at least one connection portion connecting two of said at least two birefringence fibers such that eigen axes of one birefringence fiber are substantially orthogonal to eigen axes of the other birefringence fiber, said at least one connection portion being provided between an incident end of said optical fiber and said reflective portion, and
wherein a resonator length $L_{LD}$ and a refractive index $n_{LD}$ of said semiconductor laser element are selected such that a phase difference ΔΦ of the reflected light evaluated at said incident end between a component of light made incident in the X-axis and returned in the X-axis and a component of light made incident in the Y-axis and returned in the Y-axis is more than $4\pi \cdot n_{LD} \cdot L_{LD}/\lambda$, with λ being an oscillation wavelength of said semiconductor laser element.

14. The semiconductor laser module of claim 1, wherein an oscillation wavelength of said semiconductor laser element is within 980 nm band.

15. The semiconductor laser module of claim 13, wherein an oscillation wavelength of said semiconductor laser element is within 980 nm band.

16. The semiconductor laser module of claim 1, wherein said semiconductor laser element is of a ridge waveguide structure.

17. The semiconductor laser module of claim 13, wherein the semiconductor laser element is of a ridge waveguide structure.

18. The semiconductor laser module of claim 7, wherein
each of said two birefringence fiber is any of a PANDA fiber having the stress-applying part with a circular cross section, a bow-tie fiber having the stress-applying part with a sectorial cross section, an elliptical jacket fiber having the stress-applying part with an elliptical cross section, or an elliptical core fiber having an axially asymmetric waveguide structure of a core thereof.

19. A semiconductor laser light source comprising:
a semiconductor laser element; and
an optical fiber optically coupled to a laser element by an optical coupling system,
wherein said optical fiber is provided with a reflective portion configured to reflect light emitted from said semiconductor laser element thereby to constitute an external cavity together with said semiconductor laser element, and
wherein said optical fiber comprises at least two birefringence fibers each having two eigen axes, and has at least one connection portion connecting two of said at least two birefringence fibers such that eigen axes of one birefringence fiber are substantially orthogonal to eigen axes of the other birefringence fiber, said at least one connection portion being provided between an incident end of said optical fiber and said reflective portion.

20. A semiconductor laser light source comprising:
a semiconductor laser element; and
an optical fiber optically coupled to the laser element by an optical coupling system,
wherein said optical fiber is provided with a reflective portion configured to reflect light emitted from said semiconductor laser element thereby to constitute an external cavity together with said semiconductor laser element, wherein said optical fiber comprises at least two birefringence fibers each having two eigen axes of X-axis and Y-axis which are orthogonal to and have different refractive indexes from each other, said optical fiber having at least one connection portion connecting two of said at least two birefringence fibers such that eigen axes of one birefringence fiber are substantially orthogonal to eigen axes of the other birefringence fiber, said at least one connection portion being provided between an incident end of said optical fiber and said reflective portion, and wherein a resonator length $L_{LD}$ and a refractive index $n_{LD}$ of said semiconductor laser element are selected such that a phase difference $\Delta\Phi$ of the reflected light evaluated at said incident end between a component of light made incident in the X-axis and returned in the X-axis and a component of light made incident in the Y-axis and returned in the Y-axis is more than $4\pi \cdot n_{LD} \cdot L_{LD}/\lambda$, with $\lambda$ being an oscillation wavelength of said semiconductor laser element.

* * * * *